United States Patent
Liebmann et al.

(10) Patent No.: US 11,923,364 B2
(45) Date of Patent: Mar. 5, 2024

(54) DOUBLE CROSS-COUPLE FOR TWO-ROW FLIP-FLOP USING CFET

(71) Applicant: Tokyo Electron Limited, Tokyo (JP)

(72) Inventors: Lars Liebmann, Albany, NY (US); Jeffrey Smith, Clifton Park, NY (US); Daniel Chanemougame, Albany, NY (US); Paul Gutwin, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 302 days.

(21) Appl. No.: 17/328,446

(22) Filed: May 24, 2021

(65) Prior Publication Data

US 2022/0181322 A1 Jun. 9, 2022

Related U.S. Application Data

(60) Provisional application No. 63/121,608, filed on Dec. 4, 2020.

(51) Int. Cl.
*H01L 27/092* (2006.01)
*H01L 23/528* (2006.01)
*H01L 23/532* (2006.01)
*H01L 29/06* (2006.01)
*H01L 29/417* (2006.01)
(Continued)

(52) U.S. Cl.
CPC ........ *H01L 27/0922* (2013.01); *H01L 23/528* (2013.01); *H01L 23/53271* (2013.01); *H01L 29/0665* (2013.01); *H01L 29/41733* (2013.01); *H01L 29/42392* (2013.01); *H01L 29/78696* (2013.01)

(58) Field of Classification Search
CPC ............... H01L 27/0922; H01L 23/528; H01L 23/53271; H01L 29/0665; H01L 29/41733; H01L 29/42392; H01L 29/78696; H01L 21/823871; H01L 27/092; H01L 21/823807; H01L 29/0673; H01L 29/775; H01L 21/8221; H01L 27/0688; B82Y 10/00
USPC ........................................................ 257/351
See application file for complete search history.

(56) References Cited

U.S. PATENT DOCUMENTS

| | | | |
|---|---|---|---|
| 10,685,887 B2 | 6/2020 | Smith et al. | |
| 10,756,096 B2 | 8/2020 | Paul et al. | |
| (Continued) | | | |

FOREIGN PATENT DOCUMENTS

| | | |
|---|---|---|
| KR | 10-2020-0037107 A | 4/2020 |
| WO | WO 2019/112952 A1 | 6/2019 |

OTHER PUBLICATIONS

International Search Report and Written Opinion dated Feb. 10, 2022 in PCT/US2021/055513, 9 pages.

*Primary Examiner* — Tong-Ho Kim
(74) *Attorney, Agent, or Firm* — Oblon, McClelland, Maier & Neustadt, L.L.P.

(57) ABSTRACT

A semiconductor device includes a cell array having tracks and rows formed on a substrate. The tracks extend perpendicularly to the rows. A logic cell is formed across two adjacent rows within the cell array. The logic cell includes a cross-couple (XC) in each row and a plurality of poly tracks across the two adjacent rows. Each XC includes two cross-coupled complementary field-effect-transistors. Each poly track is configured to function as an inter-row gate for the XCs. A pair of signal tracks is positioned on opposing boundaries of the logic cell and electrically coupled to the plurality of poly tracks.

20 Claims, 8 Drawing Sheets

(51) Int. Cl.
*H01L 29/423* (2006.01)
*H01L 29/786* (2006.01)

(56) References Cited

U.S. PATENT DOCUMENTS

| | | |
|---|---|---|
| 10,833,078 B2 | 11/2020 | Smith et al. |
| 10,977,417 B2 | 4/2021 | Peng et al. |
| 11,063,045 B2 | 7/2021 | Wu et al. |
| 2019/0172755 A1 | 6/2019 | Smith et al. |
| 2019/0172828 A1 | 6/2019 | Smith et al. |
| 2019/0386011 A1* | 12/2019 | Weckx ................. G11C 11/412 |
| 2020/0104460 A1* | 4/2020 | Peng ................... H01L 27/0688 |
| 2020/0111798 A1 | 4/2020 | Paul et al. |
| 2020/0328212 A1 | 10/2020 | Wu et al. |
| 2021/0028169 A1 | 1/2021 | Smith et al. |
| 2021/0233990 A1 | 7/2021 | Peng et al. |
| 2021/0343715 A1 | 11/2021 | Wu et al. |

\* cited by examiner

DOUBLE CROSS-COUPLE FOR TWO-ROW FLIP-FLOP USING CFET

INCORPORATION BY REFERENCE

This present disclosure claims the benefit of U.S. Provisional Application No. 63/121,608, filed on Dec. 4, 2020, the entire content of which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device.

An aspect (1) includes a semiconductor device. The semiconductor device includes a cell array including tracks and rows formed on a substrate. The tracks extend perpendicularly to the rows. A logic cell is formed across two adjacent rows within the cell array. The logic cell includes a cross-couple (XC) in each row and a plurality of poly tracks across the two adjacent rows. Each XC includes two cross-coupled complementary field-effect-transistors (CFETs), and each poly track is configured to function as an inter-row gate for the XCs. A pair of signal tracks is positioned on opposing boundaries of the logic cell and electrically coupled to the plurality of poly tracks.

An aspect (2) includes the semiconductor device of aspect (1), wherein the plurality of poly tracks includes a first poly track and a second poly track that is positioned above the first poly track, and a third poly track and a fourth poly track that is positioned above the third poly track.

An aspect (3) includes the semiconductor device of aspect (2), wherein the adjacent two rows include a first row and a second row. The CFETs include a first CFET and a second CFET in the first row and a third CFET and a fourth CFET in the second row, and the pair of signal tracks includes a first signal track and a second signal track.

An aspect (4) includes the semiconductor device of aspect (3), wherein the first poly track is configured to function as a lower inter-row gate for the first and third CFETs. The second poly track is configured to function as an upper inter-row gate for the first and third CFETs. The third poly track is configured to function as a lower inter-row gate for the second and fourth CFETs, and the fourth poly track is configured to function as an upper inter-row gate for the second and fourth CFETs.

An aspect (5) includes the semiconductor device of aspect (4), further including a first conductive trace and a fourth conductive trace that are configured to electrically couple the first poly track and the fourth poly track to the first signal track, respectively. A second conductive trace and a third conductive trace are configured to electrically couple the second poly track and the third poly track to the second signal track, respectively.

An aspect (6) includes the semiconductor device of aspect (5), wherein the second poly track is staggered above the first poly track so that the first conductive trace bypasses the second poly track. The fourth poly track is staggered above the third poly track so that the third conductive trace bypasses the fourth poly track.

An aspect (7) includes the semiconductor device of aspect (3), further including a first terminal structure configured to electrically couple two source/drain (S/D) regions of the first CFET and two S/D regions of the second CFET. A second terminal structure is configured to electrically couple remaining S/D regions of the first CFET. A third terminal structure is configured to electrically couple remaining S/D regions of the second CFET.

An aspect (8) includes the semiconductor device of aspect (7), further including a fourth terminal structure configured to electrically couple two S/D regions of the third CFET and two S/D regions of the fourth CFET. A fifth terminal structure is configured to electrically couple remaining S/D regions of the third CFET. A sixth terminal structure is configured to electrically couple remaining S/D regions of the fourth CFET.

An aspect (9) includes the semiconductor device of aspect (2), wherein the first poly track and the second poly track are spatially separated and electrically isolated from each other so as to function as split gates for respective CFETs. The third poly track and the fourth poly track are spatially separated and electrically isolated from each other so as to function as split gates for respective CFETs.

An aspect (10) includes the semiconductor device of aspect (2), wherein the first poly track and the second poly track occupy only one track width in a direction parallel to the rows. The third poly track and the fourth poly track occupy only one track width in the direction parallel to the rows.

An aspect (11) includes the semiconductor device of aspect (1), further including a wiring structure configured to access the XCs from the pair of signal tracks.

An aspect (12) includes the semiconductor device of aspect (1), wherein the XCs are positioned on same poly tracks.

An aspect (13) includes the semiconductor device of aspect (1), wherein the plurality of poly tracks includes polysilicon.

An aspect (14) includes the semiconductor device of aspect (1), wherein each CFET includes an n-type transistor and a p-type transistor stacked over each other relative to a surface of the substrate.

An aspect (15) includes the semiconductor device of aspect (14), wherein each n-type transistor is positioned over the respective p-type transistor within each CFET.

An aspect (16) includes the semiconductor device of aspect (14), wherein the n-type transistors and the p-type transistors are gate-all-around transistors that include channels extending in a direction parallel to the rows and surrounded by respective poly tracks.

An aspect (17) includes the semiconductor device of aspect (1), wherein the logic cell is formed across more than two adjacent rows within the cell array. The logic cell includes an XC in each row and a plurality of poly tracks across the more than two adjacent rows.

An aspect (18) includes the semiconductor device of aspect (17), wherein all the XCs are positioned on four common poly tracks that are configured to function as inter-row gates.

An aspect (19) includes the semiconductor device of aspect (1), further including an inverter configured to invert an input signal of the inverter into an output signal of the inverter. The output signal is an inverted signal of the input signal.

An aspect (20) includes the semiconductor device of aspect (19), wherein the input signal of the inverter is also an input signal of two gates of a particular XC. The output signal of the inverter is an input signal of remaining gates of the particular XC.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein include a novel construct and the associated process integration solution that enables efficient and compact integration of transistors into dense 3D logic functions including integration of complementary field-effect transistor (CFET) designs into double row-height layouts. More details on CFET can be found in U.S. Ser. No. 16/848,366 (semiconductor apparatus having stacked devices and method of manufacture thereof) as well as U.S. Ser. No. 16/206,513 (semiconductor apparatus having stacked gates and method of manufacture thereof) which are incorporated by reference.

Stacking complementary channels vertically in CFET rather than placing them laterally next to each other in finFET or lateral nano-sheet, has well-documented area and drive-strength benefits and also results in very useful connectivity benefits as illustrated in FIGS. 2 and 3A-3C taken from the referenced patent disclosure, U.S. Ser. No. 16/848, 366.

Figure 2:
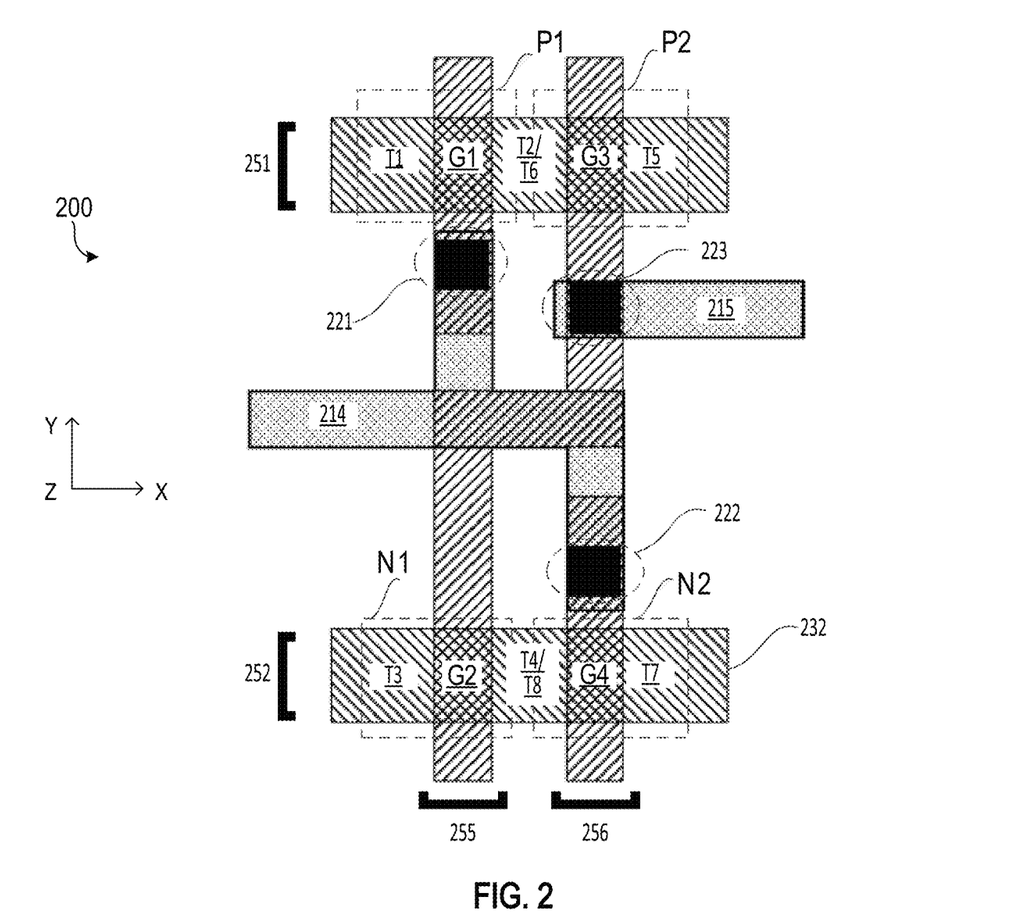
FIG. 2 shows a top view of a 2D semiconductor device.

FIG. 2 shows a top view of a 2D semiconductor device 200. In some embodiments, FIG. 2 shows a cross-couple (XC) for conventional CMOS device. Herein, the 2D semiconductor device 200 includes a first CFET having P1 and N1 as well as a second CFET having P2 and N2. In a non-limiting example, P1 and P2 are p-type transistors while N1 and N2 are n-type transistors. P1, N1, P2 and N2 include gates G1, G2, G3 and G4, respectively. P1, N1, P2 and N2 include source/drain (S/D) terminals T1-T2, T3-T4, T5-T6 and T7-T8, respectively. P1 and P2 are positioned in a first row 251 while N1 and N2 are positioned in a second row 252. Additionally, the S/D terminals T2 and T6 are adjacent to each other and electrically coupled, and the S/D terminals T4 and T8 are adjacent to each other and electrically coupled.

Further, G1 and G4 are electrically connected via contact traces 221 and 222 and a conductive structure 214. G2 and G3 are also electrically connected to each other and are further connected to a conductive structure 215 via a contact trace 223. A connectivity benefit of CFET in FIG. 2 is that a pair of cross-coupled transistors can be formed with fewer contacts, fewer metal tracks, and with fully orthogonal wiring. This leaves more of the precious few signal wiring tracks available for in-cell and intra-cell routing, improving overall transistor density and performance.

Figure 3A:
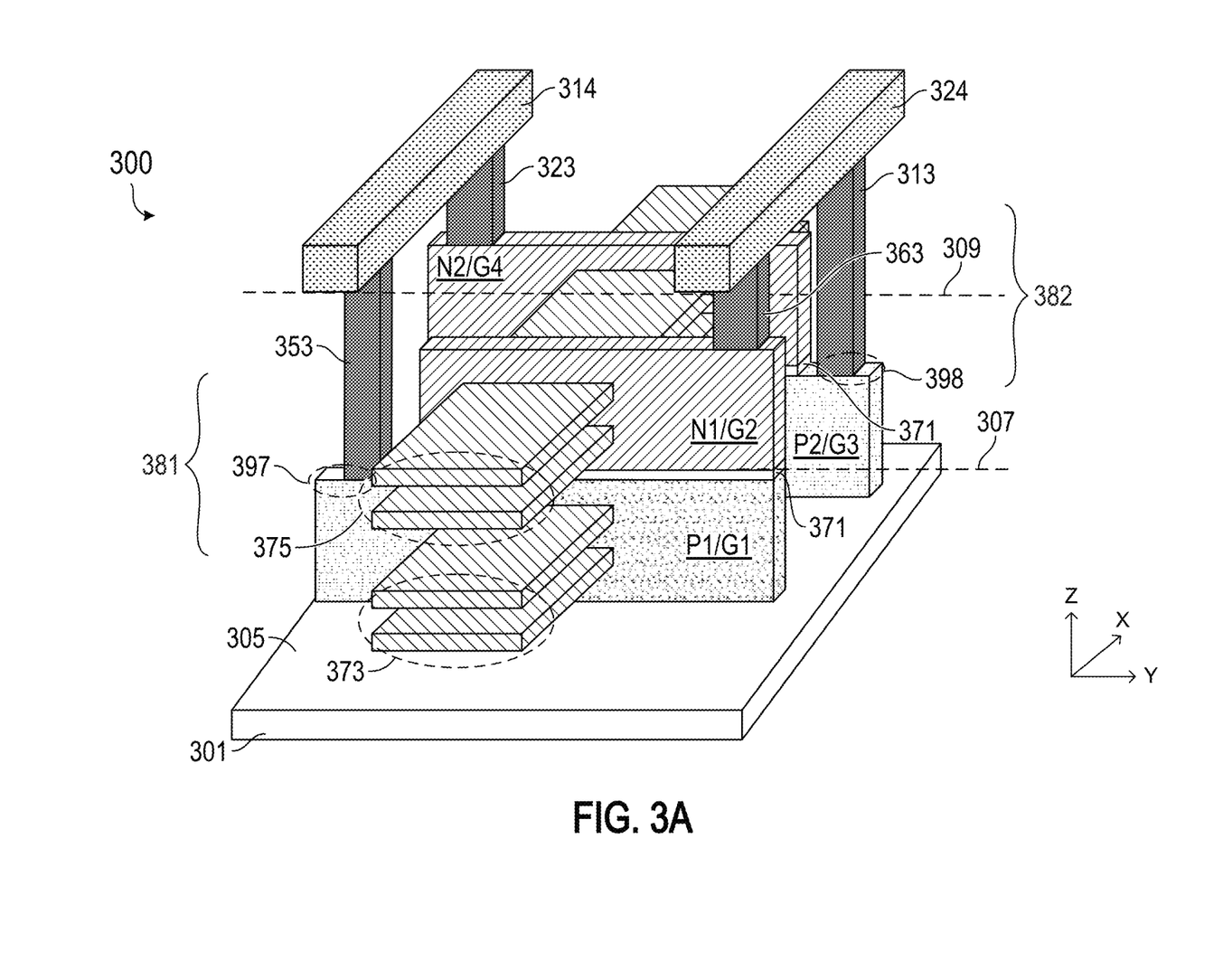
FIGS. 3A and 3B show a perspective view and a top view of a 3D semiconductor device, respectively.
Figure 3B:
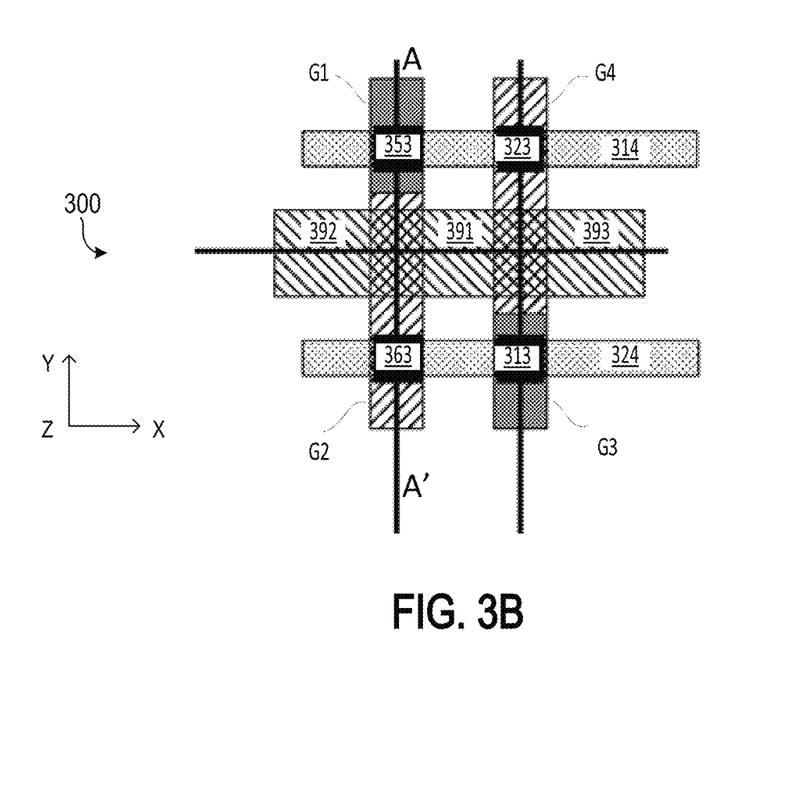

FIGS. 3A and 3B show a perspective view and a top view of a 3D semiconductor device 300, respectively. In some embodiments, FIGS. 3A and 3B illustrate a transmission gate pair of a multiplexer (MUX). Accordingly, the 3D semiconductor device 300 includes a first stack of transistors 381 having P1 formed on a substrate 301 of the 3D semiconductor device 300 and N1 stacked on P1 along a z direction substantially perpendicular to a substrate plane 305 of the substrate 301. In an example, P1 is formed on the substrate plane 305, and N1 is formed on a plane 307 that is parallel to the substrate plane 305. P1 includes a gate G1, and N1 includes a gate G2. The 3D semiconductor device 300 also includes a second stack of transistors 382 having P2 formed on the substrate 301 and N2 stacked on P2 along the Z direction. In an example, P2 is formed on the substrate plane 305, and N2 is formed on the plane 307. P2 includes a gate G3, and N2 includes a gate G4.

In some embodiments, the first stack of transistors 381 implements a first transmission gate, and the second stack of transistors 382 implements a second transmission gate. Since the gates G1 and G2 of the first stack of transistors 381 are controlled by different signals (e.g., 'sel' and '!sel' of the aforementioned MUX), the gates G1-G2 can be referred to as split gates. Similarly, the gates G3 and G4 can also referred to as split gates. Split gates refer to a stack of gates separated physically and electrically, and are conductively (or electrically) connected to separate routing tracks (or signal tracks) via separate conductive traces. For example, the gates G1 and G2 are separated and conductively isolated by a dielectric layer 371 including one or more dielectric materials, and the gates G3 and G4 are separated and conductively isolated by the dielectric layer 371. Alternatively, the gates G3-G4 can be separated and conductively isolated by a dielectric layer that is different from the dielectric layer 371.

Split gates typically have independent connections to be connected to different electrical signals. For example, a first conductive trace 353 and a fourth conductive trace 323 can be configured to conductively couple the gates G1 and G4 to a first routing track 314 (also referred to as a first signal track), respectively. A second conductive trace 363 and a third conductive trace 313 can be configured to conductively couple the gates G2 and G3 to a second routing track 324 (also referred to as a second signal track), respectively. Accordingly, the first routing track 314 and the second routing track 324 that is electrically isolated from the first routing track 314 are formed to provide different signals, for example, 'sel' and '!sel', respectively. In an example, the gates G1 and G2 are coupled to 'sel' and '!sel', via the first and second conductive traces 353 and 363, respectively, and G3 and G4 are coupled to '!sel' and 'sel' via the third and fourth conductive traces 313 and 323, respectively.

In an example, P1 and P2 are p-type transistors, such as p-type field-effect transistors (pFETs), and N1 and N2 are n-type transistors, such as n-type FETs (nFETs). Note that a gate (e.g., G1) of a pFET (e.g., P1) of one stack (e.g., 381) and a gate (e.g., G4) of an nFET (e.g., N2) of the other stack (e.g., 382) can be offset from each other both horizontally and vertically in the z direction, and share or access a same routing track (e.g., the first routing track 314), thus alleviating the need for additional metallization, such as nFET to pFET crossing required in some planar complementary FETs (CFETs), and reducing routing congestion.

Still referring to FIGS. 3A and 3B, the first and second routing tracks 314 and 324 are substantially parallel along an x direction (or extend in the x direction) that is perpendicular to the z direction. In an example, the first and second routing tracks 314 and 324 are conductively coupled to 'sel' and '!sel', respectively. 'sel' and '!sel' can be configured at an opposite logic-level to each other. The first and second routing tracks 314 and 324 can be positioned on any suitable routing plane(s). In an example, the first and second routing tracks 314 and 324 can be positioned on a plane 309 above the first stack of transistors 381 and the second stack of transistors 382.

In an embodiment, 'sel' is a logic 1, and '!sel' is a logic 0. P1 and N1 can function as 'open switches', and thus the first stack of transistors 381 functions as an 'open switch'. Meanwhile, P2 and N2 can function as 'closed switches', and thus the second stack of transistors 382 functions as a 'closed switch'. In another embodiment, 'sel' is a logic 0, and '!sel' is a logic 1. Accordingly, the first stack of transistors 381 functions as a 'closed switch', and the second stack of transistors 382 functions as an 'open switch'.

In a non-limiting example, a portion 397 at a first end of G1 is exposed (e.g., not covered by N1 and G2) such that the first routing track 314 can be connected to G1 via the first conductive trace 353 at the portion 397. For a neighboring transistor pair (e.g., P2 and N2), a portion 398 at a second end of G3 of the lower-transistor (P2) is exposed (e.g., not covered by N2 and G4) such that the second routing track 324 can be connected to G3 via the third conductive trace 313 at the portion 398. Exposure of the lower gates (e.g., G1 and G3) can be achieved by any suitable manufacturing processes such as a variety of line-end cut approaches or different direct patterning solutions. The 3D semiconductor device 300 can include the first and second routing tracks 314 and 324 (e.g., a pair of unidirectional conductive wires) with one delivering the control signal (in a non-limiting example, 'sel') and the other delivering the inverted signal (e.g., '!sel') to the respective sets of neighboring transistor pairs.

As described above, split gate approaches can selectively expose and contact a bottom transistor (e.g., P1) or a bottom gate (e.g., G1), and thus can allow a single unidirectional metal line (e.g., the first routing track 314) to conductively couple with the gate G1 of P1 via the first conductive trace 353 while conductively coupling with the gate G4 of N2 via the fourth conductive trace 323. Further, the split gates G1 and G2 can be staggered or shifted, for example, along the y direction. Accordingly, the portion 397 (e.g., at the first end of G1) of the lower gate G1 can be exposed so that the first conductive trace 353 can access G1 and bypass the upper gate G2 and the upper transistor N1. A location of the portion 397 can be at any suitable location of G1 where the suitable location allows the first conductive trace 353 to bypass N1 and G2. Similarly, a location of the portion 398 can be at any suitable location of G3 where the suitable location allows the third conductive trace 313 to bypass N2 and G4.

Still referring to FIGS. 3A and 3B, the 3D semiconductor device 300 can further include first channel structures 373 and second channel structures 375. The first channel structures 373 can include portions surrounded by the gates G1 and G3, respectively. The second channel structures 375 can include portions surrounded by the gates G2 and G4, respectively. The first channel structures 373 and the second channel structures 375 can have any suitable structure (including shapes and dimensions) and material systems so that the portions surrounded by G1 or G3 can provide a semiconductor channel, such as a p-channel, when P1 or P3 is in operation; the portions surrounded by G2 or G4 can provide a semiconductor channel, such as a n-channel, when N1 or N2 is in operation.

In a non-limiting example, the first channel structures 373 include a first set of semiconductor bars (e.g., two semiconductor bars) stacked along the z direction, and the second channel structures 375 include a second set of semiconductor bars (e.g., two semiconductor bars) stacked along the z direction. A gate (e.g., G1, G2, G3 or G4) can cover or surround a respective channel structure (e.g., a portion of 373 or a portion of 375) in any suitable configuration, such as that used in Fin FET (FinFET), gate-all-around (GAA), tri-gate, Pi-gate, and the like. Gate materials can surround the respective channel structures on all sides in the GAA configuration as shown in the FIGS. 3A and 3B example.

In addition, the 3D semiconductor device 300 further includes a first terminal structure 391 that conductively couples one source/drain (S/D) region (not shown) of each transistor (e.g., P1, N1, P2 and N2) to provide an output signal. A second terminal structure 392 conductively couples remaining S/D regions of P1 and N1. A third terminal structure 393 conductively couples remaining S/D regions of P2 and N2. The first, second and third terminal structures 391-393 can include any suitable conductive materials. The 3D semiconductor device 300 can further include additional components, such as conductive traces to couple the first, second and third terminal structures 391-393 to input and/or signal tracks. Note that the first, second and third terminal structures 391-393 are not illustrated in FIG. 3A in order to show the first and second channel structures 373 and 375.

Figure 3C:
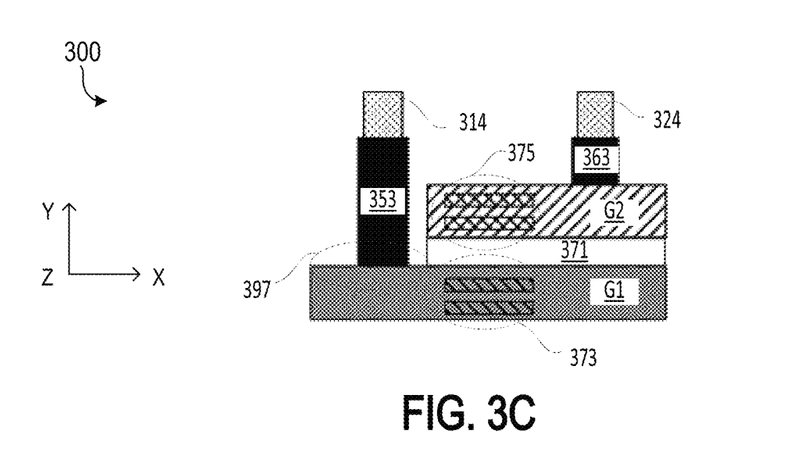
FIG. 3C shows a cross-sectional view of the 3D semiconductor device taken along AA' in FIG. 3B.

FIG. 3C shows a cross-sectional view of the 3D semiconductor device taken along AA' in FIG. 3B. In this example, G2 is stacked over G1, and the split gates G1 and G2 are staggered. The first conductive trace 353 is connected to G1 at the portion 397 that is exposed (e.g., not covered by the gate G2 above the gate G1). As a result, the first conductive trace 353 bypasses G2 and N1. The second conductive trace 363 is connected to G2. Similarly, the split gates G3 and G4 are staggered so that the third conductive trace 313 bypasses G4 and N2.

Figure 4A:
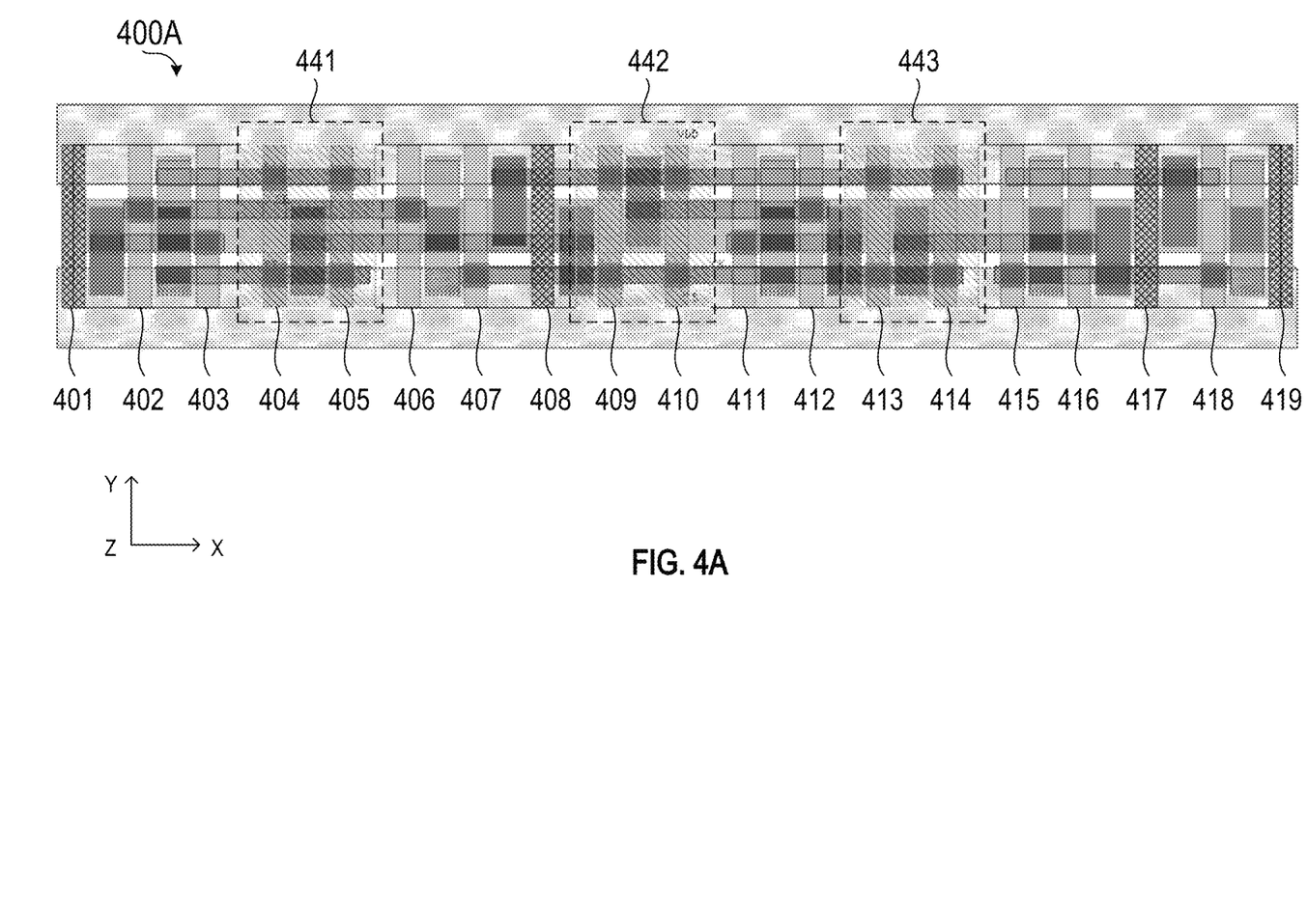
FIG. 4A shows a layout diagram of a semiconductor device having a single-row configuration.
Figure 4B:
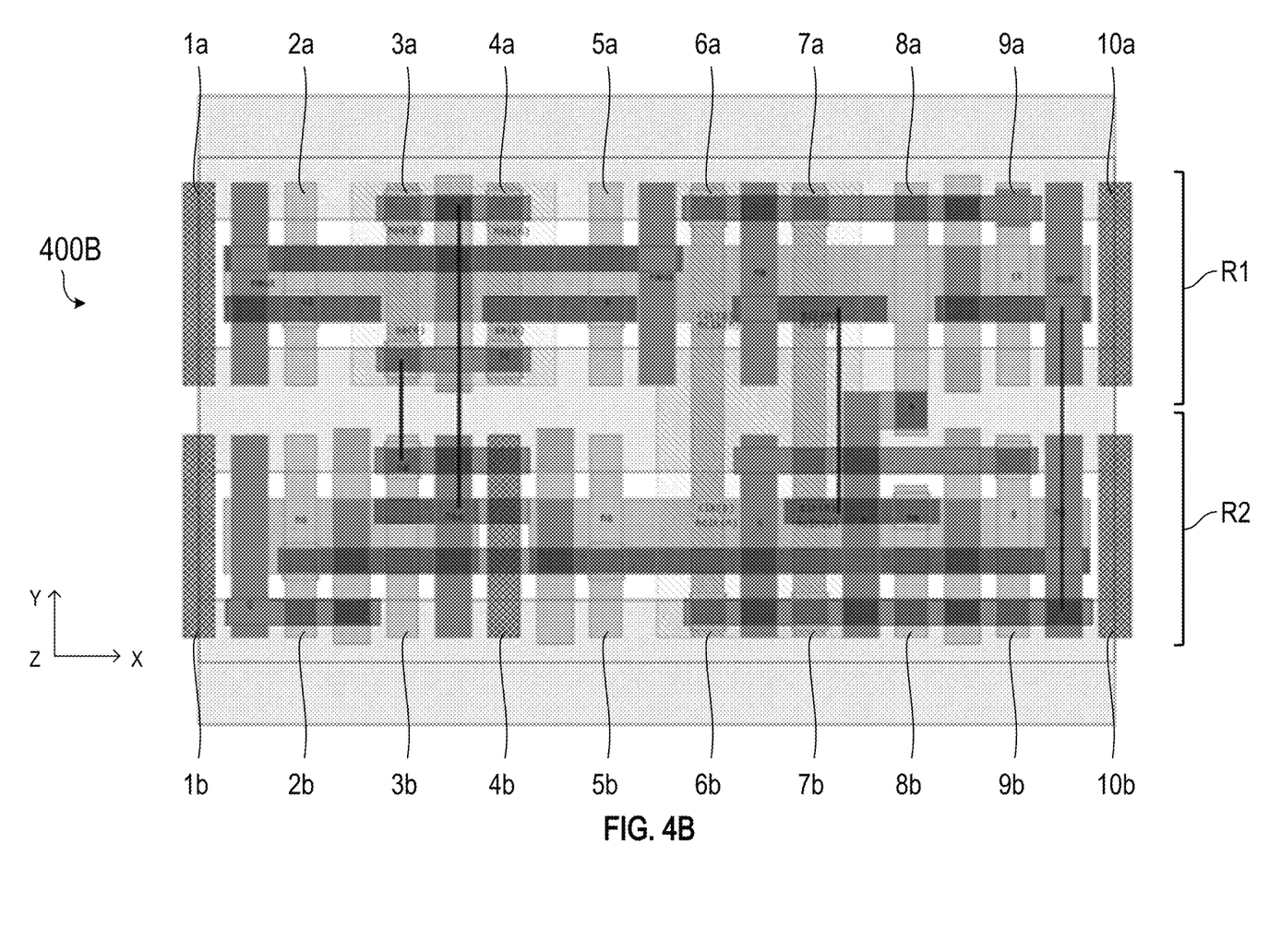
FIG. 4B shows a layout diagram of a semiconductor device having a two-row configuration, in accordance with an embodiment of the present disclosure.
Figure 4C:
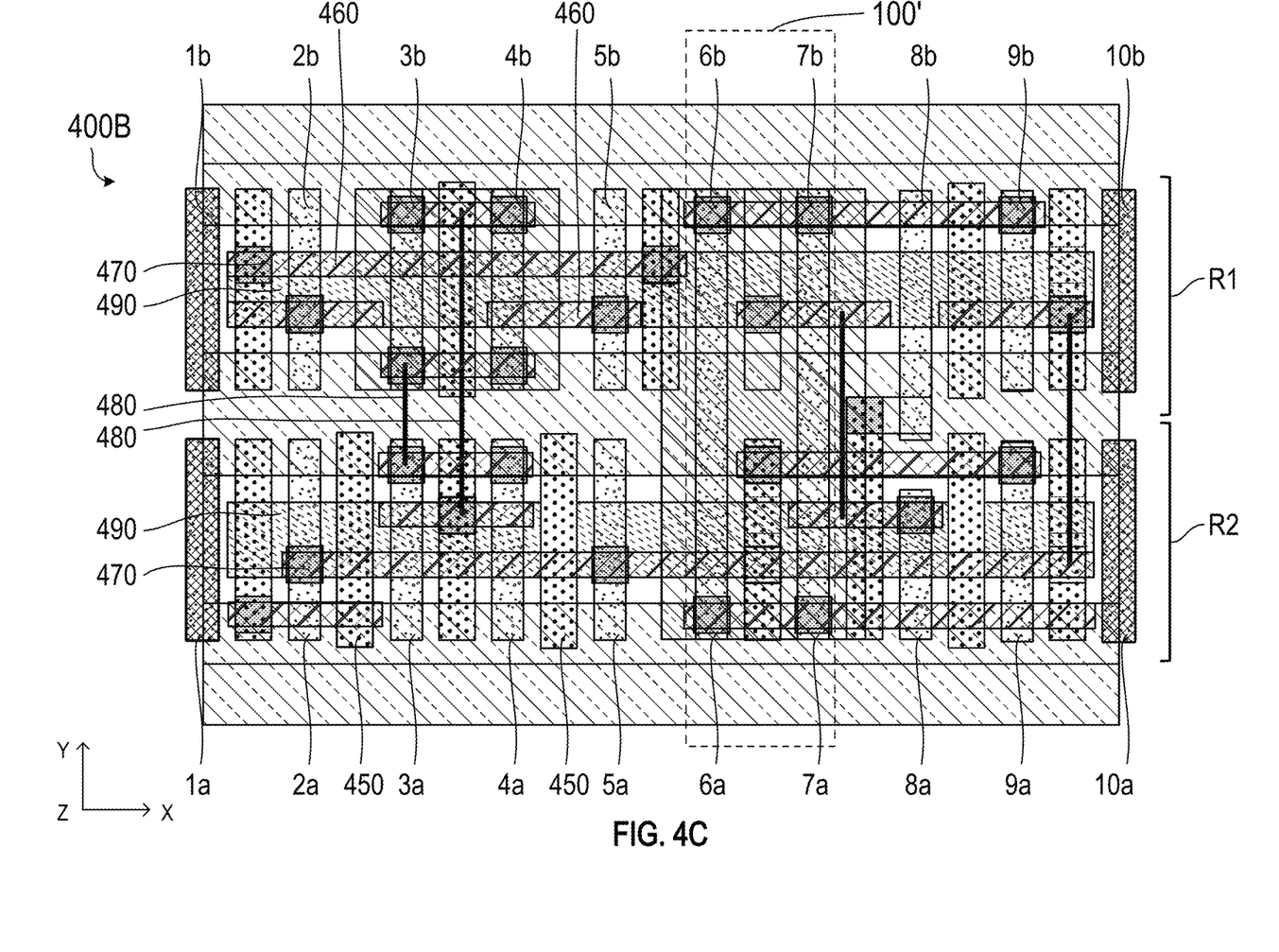
FIG. 4C shows an alternative layout diagram of the semiconductor device shown in FIG. 4B, in accordance with an embodiment of the present disclosure.

To improve power distribution and ability to route complex logic cells, the semiconductor industry is looking at double-height designs, as illustrated in FIGS. 4A-4C. Particularly, FIG. 4A shows a layout diagram of a semiconductor device 400A having a single-row configuration. In some embodiments, the semiconductor device 400A includes a semi-dynamic flip-flop (SDFF) cell or SDFF circuit. In a non-limiting example, the semiconductor device 400A includes nineteen tracks, 401, 402, 403, 404, 405, 406, 407, 408, 409, 410, 411, 412, 413, 414, 415, 416, 417, 418, and 419. The tracks 410-419 extend in the y direction and include a gate material, such as polysilicon. Accordingly, the tracks 410-419 are also referred to as polysilicon tracks or poly tracks. Note that the tracks 401 and 419 are positioned on cell boundaries of the SDFF cell and are thus shared with neighboring cells (now shown). As a result, the tracks 401 and 419 each occupy only half a track width (or half a poly track width), and the SDFF cell occupies eighteen tracks' width.

The SDFF cell used as an example herein in FIG. 4A occupies eighteen poly tracks when designed in a single-row configuration but can also be rendered in two rows of nine poly tracks width as shown a semiconductor device 400B in FIG. 4B. The semiconductor device 400B includes two rows, R1 and R2 that extend in the x direction. In a non-limiting example, the semiconductor device 400B includes twenty tracks, 1a, 2a, 3a, 4a, 5a, 6a, 7a, 8a, 9a, 10a, 1b, 2b, 3b, 4b, 5b, 6b, 7b, 8b, 9b and 10b that extend in the y direction. The rows and the tracks extend perpendicularly to one another. The tracks are aligned so that a particular track (e.g., 2a) in R1 occupies a same track width as a respective track in R2 (e.g., 2b). Similar to the tracks 401 and 419 in FIG. 4A, the tracks 1a, 1b, 10a and 10b are positioned on cell boundaries and shared with neighboring cells (not shown). Ergo, the SDFF cell of the semiconductor device 400B only occupies nine tracks' width. While the primary objective of the two-row design is to render large cells in an aspect ratio that lends itself better to power-distribution-network (PDN) optimization, the secondary objective is to relieve wiring congestion, especially around signal pins.

Techniques herein can be applied to circuit design and especially to large, complex, sequential logic cells. Generally the most important standard cells in any logic designs are latches and flip-flops because every logic path of combinatorial cells initiates and terminates on these sequential cells. Indeed, 25-40% of a logic block's area is occupied by latches and flip-flops. It is therefore very beneficial to render these cells as compactly as possible. The most important layout component (referred to herein as a construct) of all latches and flip-flops is a pair of cross-coupled transistors, commonly referred to as cross-couple (XC) for short. The SDFF circuit is used as an example to illustrate embodiments herein. The semiconductor device 400A contains three sets of XCs (identified by the diagonal-hatched regions 441, 442 and 443 in FIG. 4A). Wiring XCs efficiently and reliably has long been a mayor priority and significant challenge for design-technology co-optimization (DTCO). Techniques herein include a construct that minimizes the number of blocked wiring tracks for a pair of cross-couples in a two-row flip-flop design.

Embodiments herein provide efficient XC in CFET and associated feature split-gate CFET in two-row layouts. Accordingly, techniques provide a stacked device with optimized transistor placement to bring matched pairs of XC onto the same poly tracks on two separate layout rows. A wiring configuration is provided that accesses the pair of XC from the two outer-most signal tracks in the two-row layout. Also disclosed is an integration flow that enables the split-gate poly to act as a local interconnect across the horizontal cell boundary.

Flip-flop circuits are highly complex circuit designs. In an embodiment, a layout design has thirty transistors forming nine complementary pairs using common-gate connections and three sets of XCs with four transistors each. A preferred transistor placement for a two-row CFET implementation places the complementary pairs of XC used in the flip-flop circuit on the same poly tracks but on separate rows. Frugal use of signal wires to avoid cell area growth or pin access congestion is highly desirable.

In some embodiments, inter-row connectivity is facilitated by using split gate poly as a local interconnect. This technique allows the single connections for each n-gate and p-gate of the two CFETs in an XC to be made using four contacts on only two metal tracks to wire eight transistors into two XC.

The layout efficiency of a double XC in a two-row layout is shown in FIG. 4C with the pair of XC highlighted by the rectangle 100'. Note that FIG. 4C shows an alternative layout diagram of the semiconductor device 400B shown in FIG. 4B. In other words, the layout diagrams in FIGS. 4B and 4C are equivalent circuit diagrams. In a non-limiting example, the tracks 1a-10a and 1b-10b are polysilicon tracks that are configured to function as device gates. Source/drain (S/D) local interconnect (LI) structures 450 are disposed between the gate tracks and extend in the y direction. The semiconductor device 400B also includes wiring structures 460 (e.g., power and signal wiring) that extend in the x direction and conductive structures 470 that electrically couple the wiring structures 460 to corresponding tracks and/or S/D LI structures 450. The semiconductor device 400B further includes device channels 490 that extend in the x direction. The tracks 1a-10a and 1b-10b can cover or surround a respective channel in any suitable configuration, such as that used in Fin FET (FinFET), gate-all-around (GAA), tri-gate, Pi-gate, and the like. In addition, black lines 480 indicate M1 wiring to be added.

Figure 1A:
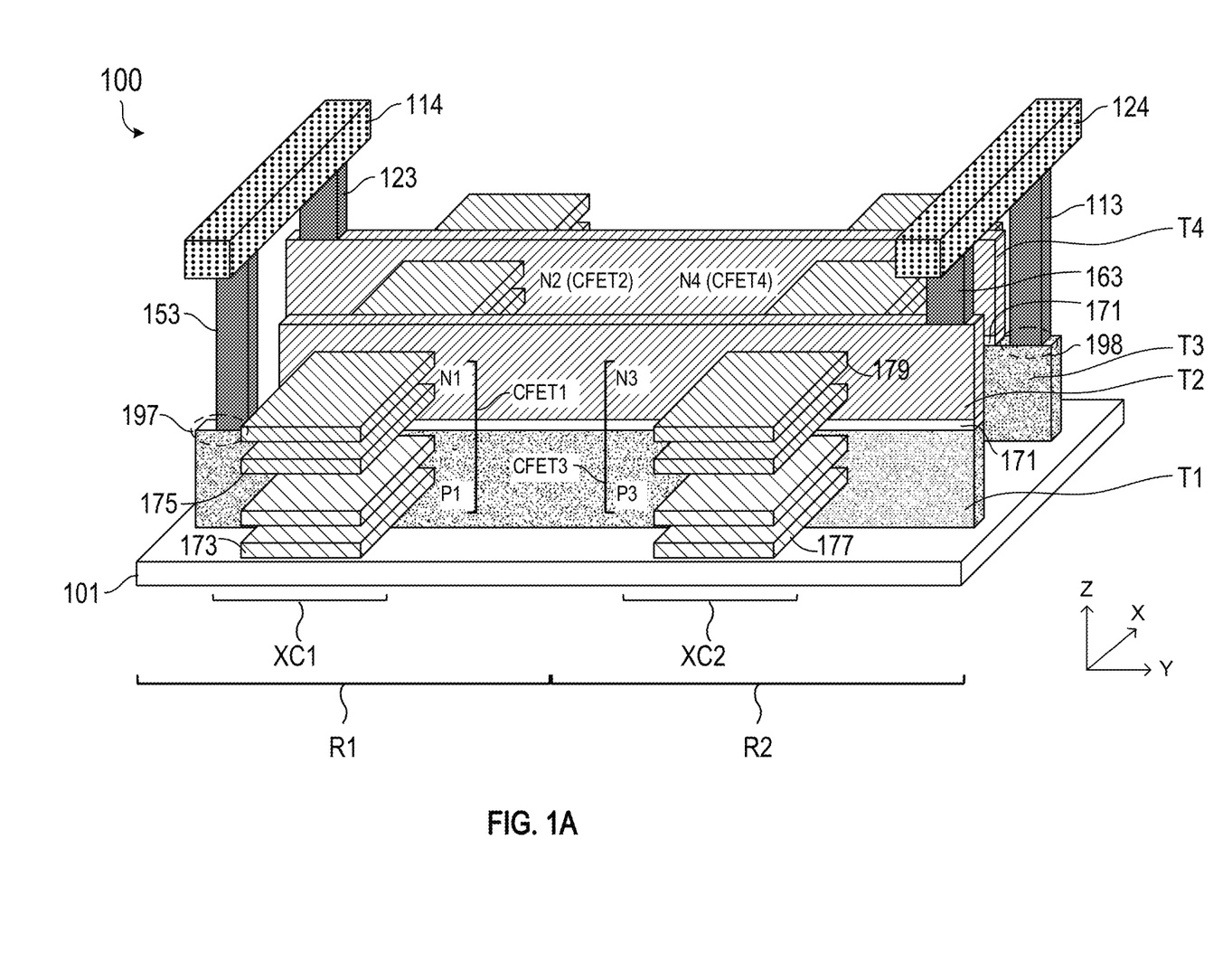
FIGS. 1A and 1B are a perspective view and a top-down layout of a semiconductor device, respectively, in accordance with some embodiments of the present disclosure.
Figure 1B:
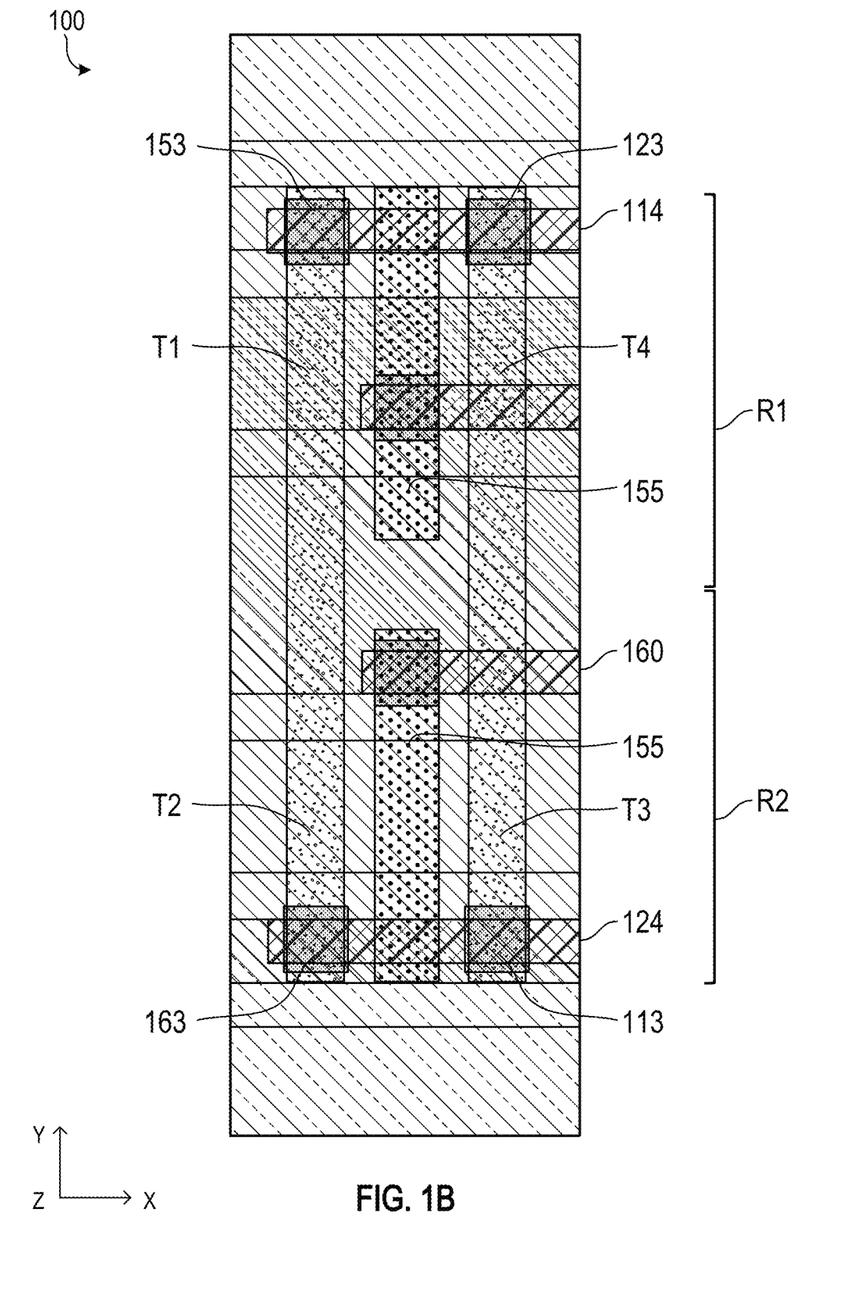

FIGS. 1A and 1B also illustrate example embodiments, specifically a detailed view of a double-height cross-couple pair in a two-row CFET layout. Several elements are shown in FIGS. 1A and 1B including placement of the pair of XC on the same poly tracks on two layout rows. A pair of connections is shown only on the outermost wiring tracks. Inter-row connectivity uses split-gate poly tracks. FIGS. 1A and 1B are a perspective view and a top-down layout of a semiconductor device 100, respectively, in accordance with some embodiments of the present disclosure. Note that in some embodiments, FIG. 1B is a detailed view of the rectangle 100' in FIG. 4B.

The semiconductor device 100 includes a cell array having tracks (e.g., T1, T2, T3 and T4) and rows (e.g., R1 and R2) formed on a substrate 101. The tracks and the rows extend in the y and x directions, respectively, so that the tracks extend perpendicularly to the rows. A logic cell is formed across two adjacent rows (e.g., R1 and R2) within the cell array. The logic cell includes an XC (e.g., XC1) in each row (e.g., R1) and a plurality of poly tracks (e.g., T1-T4) across the two adjacent rows. Each XC (e.g., XC1) includes two cross-coupled CFETs (e.g., CFET1 and CFET2), and each poly track (e.g., T1) is configured to function as an inter-row gate connection for the XCs. A pair of signal tracks (also referred to as routing tracks), such as a first signal track 114 and a second signal track 124, is positioned on opposing boundaries of the logic cell and electrically coupled to the plurality of poly tracks. In some embodiments, the semiconductor device 100 further includes a wiring structure (not shown) that is configured to access the XCs from the pair of signal tracks.

In a non-limiting example, each CFET includes an n-type transistor (e.g., N1, N2. N3 and N4) and a p-type transistor (e.g., P1 and P3) stacked over each other relative to a surface of the substrate 101. In the example of FIGS. 1A and 1B, each n-type transistor (e.g., N1) is positioned over the respective p-type transistor (e.g., P1) within each CFET (e.g., CFET1). While a p-type transistor, P2 of CFET2 and a p-type transistor, P4 of CFET4 are not shown in FIG. 1A, it should be understood that P2 and P4 are disposed below N2 and N4, respectively. In the example of FIGS. 1A and 1B, the n-type transistors and the p-type transistors are gate-all-around (GAA) transistors that include two nanosheet channels (e.g., 173, 175, 177 and 179) extending parallel to the rows in the x direction and surrounded by respective poly tracks. In other embodiments, the n-type transistors and the p-type transistors may include any number of channels. The channels may have any suitable shape, and the poly tracks may cover or surround the channels in any suitable configuration.

Further, T2 is positioned above T1. In some embodiments, T2 and T1 are spatially separated and electrically isolated from each other by an insulating layer 171. As a result, T2 and T1 can be configured to function as split gates for CFET1 and CFET2. In the example of FIGS. 1A-1B, T2 is positioned directly above T1 so that T2 and T1 occupy only one track width in the x direction. Similarly, T4 is positioned above T3. In some embodiments, T4 and T3 are spatially separated and electrically isolated from each other by the insulating layer 171 or a different insulating layer. As a result, T4 and T3 can be configured to function as split gates for CFET3 and CFET4. In the example of FIGS. 1A-1B, T4 is positioned directly above T3 so that T4 and T3 occupy only one track width in the x direction.

Still referring to FIGS. 1A and 1B, T1 is configured to function as a lower inter-row gate for CFET1 and CFET3. That is, T1 is configured to function as a common gate for P1 and P3 and thus form inter-row connectivity. Meanwhile, T2 is configured to function as an upper inter-row gate for CFET1 and CFET3. In other words, T2 is configured to function as a common gate for N1 and N3 and thus form inter-row connectivity. Similarly, T3 is configured to function as a lower inter-row gate for CFET2 and CFET4. T4 is configured to function as an upper inter-row gate for CFET2 and CFET4. As a result, the XCs (e.g., XC1 and XC2) are positioned on same poly tracks (e.g., T1-T4).

In this example, the poly tracks T1-T4 are made of conductive polysilicon and thus are also referred to as polysilicon tracks. In other examples, the poly tracks T1-T4 may include any suitable conductive material, such as TaN, TiN, TiAl, Ru and the like. Further, in some embodiments, the channels (e.g., 173, 175, 177 and 179) are covered or surrounded by work function metals (not shown) that are connected by respective poly tracks.

Further, a first conductive trace 153 and a fourth conductive trace 123 are configured to electrically couple T1 and T4 to the first signal track 114, respectively. A second conductive trace 163 and a third conductive trace 113 are configured to electrically couple T2 and T3 to the second signal track 124, respectively. In the embodiment of FIGS. 1A and 1B, T2 is staggered above T1 so that the first conductive trace 153 bypasses T2 and contacts T1 at an exposed portion 197 of T1. Similarly, T4 is staggered above T3 so that the third conductive trace 113 bypasses T4 and contacts T3 at an exposed portion 198. Note that two poly tracks (e.g., T1 and T4) can be offset from each other both horizontally in an xy plane and vertically in the z direction, and share or access a same signal track (e.g., the first signal track 114), thus alleviating the need for additional metallization, such as nFET to pFET crossing required in some planar complementary FETs (CFETs), and reducing routing congestion.

Still referring to FIGS. 1A and 1B, a cross-sectional area of a poly track such as T1, can be a largest cross-sectional area (or a maximum cross-sectional area) when the poly track is sliced with planes parallel to the substrate 101. Thus, the cross-sectional area of the gate refers to the maximum cross-sectional area of the gate intersecting with a plane perpendicular to the z direction. In general, cross-sectional areas of poly tracks T1 and T2 can have any suitable relationship. In the example of FIGS. 1A and 1B, the cross-sectional area of T1 is larger than that of T2. In alternative examples, the cross-sectional area of T1 can also be equal to or small than that of T2, and the poly tracks G1-G2 can be staggered. Similarly, cross-sectional areas of the poly tracks T3 and T4 can have any suitable relationship. In the example of FIGS. 1A and 1B, the cross-sectional area of T3 is larger than that of T4. In alternative examples, the cross-sectional area of T3 can also be equal to or small than that of T4, and the poly tracks T3 and T4 can be staggered.

The poly tracks T1 and T2 can have any suitable spatial relationship within a plane that is parallel to substrate 101. For example, T2 can be shifted from T1 along the x direction, the y direction, and/or any direction that is parallel to the substrate 101. The above description is also applicable to the poly tracks T3 and T4. In the example of FIGS. 1A and 1B, T2 is positioned directly above T1 along the z direction, so as to maximize an overlapped area between the poly tracks T1 and T2. Similarly, T4 can be positioned directly above T3 along the Z direction. In alternative embodiments, T2 and T4 can be shifted or offset from T1 and T3 along the xy plane, respectively. As a result, locations of the exposed portions (e.g., 197 and 198) and locations of the corresponding conductive traces (e.g., 153 and 113) may vary.

In some embodiments, XC1 and XC2 are configured to function as two pairs of transmission gates for MUX. Since embodiments of XC1 and XC2 are similar to embodiments of the transmission gate pair in FIGS. 3A-3C, detailed descriptions will be omitted herein for simplicity. Particularly, an element noted as 1XX in FIGS. 1A-1B corresponds to an element noted as 3XX in FIGS. 3A-3C. Note that FIG. 3A-3C show only one XC and entail at least two signal tracks (e.g., 314 and 324). While not shown, at least four signal tracks are required for a pair of adjacent XCs in related examples of FIG. 3A-3C. Techniques herein provide a frugal wiring configuration that accesses the pair of XC from the two outer-most signal tracks in the two-row layout and forms inter-row connectivity by using the split-gate poly tracks as local interconnects across the horizontal cell boundary. As a result, techniques herein enable four contacts on only two metal tracks to wire eight transistors into two XCs.

In some embodiments, the semiconductor device 100 further includes a first terminal structure configured to electrically couple two source/drain (S/D) regions of CFET1 and two S/D regions of CFET2. A second terminal structure is configured to electrically couple remaining S/D regions of CFET1, and a third terminal structure is configured to electrically couple remaining S/D regions of CFET2. In order to better demonstrate the channels (e.g., 173, 175, 177 and 179), the terminal structures and S/D regions are not shown in FIGS. 1A-1B. Similarly, the semiconductor device 100 may further include a fourth terminal structure configured to electrically couple two S/D regions of CFET3 and two S/D regions of CFET4. A fifth terminal structure configured to electrically couple remaining S/D regions of CFET3, and a sixth terminal structure configured to electrically couple remaining S/D regions of CFET4. In some embodiments, the first and fourth terminal structures herein correspond to the first terminal structure 391 in FIG. 3B. The second and fifth terminal structures herein correspond to the second terminal structure 392 in FIG. 3B. The third and sixth terminal structures herein correspond to the third terminal structure 393 in FIG. 3B.

In some embodiments, the semiconductor device 100 further includes at least one inverter (not shown) that is configured to invert an input signal of the inverter into an output signal of the inverter. The output signal is an inverted signal of the input signal. The inverter is configured so that the input signal of the inverter is also an input signal of two gates of a particular XC (e.g., XC1), and the output signal of the inverter is an input signal of remaining gates of the particular XC (e.g., XC1).

In some embodiments, the logic cell of the semiconductor device 100 is formed across more than two adjacent rows within the cell array. The logic cell includes an XC in each row and a plurality of poly tracks across the more than two adjacent rows. Each poly track is configured to function as an inter-row gate for all the XCs. In a non-limiting example, the logic cell of the semiconductor device 100 is formed across three adjacent rows including R1, R2 and R3 (not shown), with R2 sandwiched between R1 and R3. Similarly, R3 includes an XC (e.g., XC3) having two cross-coupled CFETs (e.g., CFET5 and CFET6). Accordingly, T1 is configured to function as a lower inter-row gate for CFET1, CFET3 and CFET5. T2 is configured to function as an upper inter-row gate for CFET1, CFET3 and CFET5. T3 is configured to function as a lower inter-row gate for CFET2, CFET4 and CFET6. T4 is configured to function as an upper inter-row gate for CFET2, CFET4 and CFET6.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:
1. A semiconductor device, comprising:
 a cell array including tracks and rows formed on a substrate, the tracks extending perpendicularly to the rows;

a logic cell formed across two adjacent rows within the cell array, the logic cell including a cross-couple (XC) in each row and a plurality of poly tracks across the two adjacent rows, wherein each XC includes two cross-coupled complementary field-effect-transistors (CFETs) and each poly track is configured to function as an inter-row gate for the XCs; and a pair of signal tracks positioned on opposing boundaries of the logic cell and electrically coupled to the plurality of poly tracks.

2. The semiconductor device of claim 1, wherein the plurality of poly tracks comprises:

a first poly track and a second poly track that is positioned above the first poly track; and a third poly track and a fourth poly track that is positioned above the third poly track.

3. The semiconductor device of claim 2, wherein:

the adjacent two rows include a first row and a second row, the CFETs include a first CFET and a second CFET in the first row and a third CFET and a fourth CFET in the second row, and the pair of signal tracks includes a first signal track and a second signal track.

4. The semiconductor device of claim 3, wherein:

the first poly track is configured to function as a lower inter-row gate for the first and third CFETs, the second poly track is configured to function as an upper inter-row gate for the first and third CFETs, the third poly track is configured to function as a lower inter-row gate for the second and fourth CFETs, and the fourth poly track is configured to function as an upper inter-row gate for the second and fourth CFETs.

5. The semiconductor device of claim 4, further comprising:

a first conductive trace and a fourth conductive trace configured to electrically couple the first poly track and the fourth poly track to the first signal track, respectively; and a second conductive trace and a third conductive trace configured to electrically couple the second poly track and the third poly track to the second signal track, respectively.

6. The semiconductor device of claim 5, wherein:

the second poly track is staggered above the first poly track so that the first conductive trace bypasses the second poly track, and the fourth poly track is staggered above the third poly track so that the third conductive trace bypasses the fourth poly track.

7. The semiconductor device of claim 3, further comprising:

a first terminal structure configured to electrically couple two source/drain (S/D) regions of the first CFET and two S/D regions of the second CFET;

a second terminal structure configured to electrically couple remaining S/D regions of the first CFET; and a third terminal structure configured to electrically couple remaining S/D regions of the second CFET.

8. The semiconductor device of claim 7, further comprising:

a fourth terminal structure configured to electrically couple two S/D regions of the third CFET and two S/D regions of the fourth CFET;

a fifth terminal structure configured to electrically couple remaining S/D regions of the third CFET; and a sixth terminal structure configured to electrically couple remaining S/D regions of the fourth CFET.

9. The semiconductor device of claim 2, wherein:

the first poly track and the second poly track are spatially separated and electrically isolated from each other so as to function as split gates for respective CFETs; and the third poly track and the fourth poly track are spatially separated and electrically isolated from each other so as to function as split gates for respective CFETs.

10. The semiconductor device of claim 2, wherein:

the first poly track and the second poly track occupy only one track width in a direction parallel to the rows; and the third poly track and the fourth poly track occupy only one track width in the direction parallel to the rows.

11. The semiconductor device of claim 1, further comprising a wiring structure configured to access the XCs from the pair of signal tracks.

12. The semiconductor device of claim 1, wherein the XCs are positioned on same poly tracks.

13. The semiconductor device of claim 1, wherein the plurality of poly tracks comprises polysilicon.

14. The semiconductor device of claim 1, wherein each CFET comprises an n-type transistor and a p-type transistor stacked over each other relative to a surface of the substrate.

15. The semiconductor device of claim 14, wherein each n-type transistor is positioned over the respective p-type transistor within each CFET.

16. The semiconductor device of claim 14, wherein the n-type transistors and the p-type transistors are gate-all-around transistors that include channels extending in a direction parallel to the rows and surrounded by respective poly tracks.

17. The semiconductor device of claim 1, wherein the logic cell is formed across more than two adjacent rows within the cell array, the logic cell including an XC in each row and a plurality of poly tracks across the more than two adjacent rows.

18. The semiconductor device of claim 17, wherein all the XCs are positioned on four common poly tracks that are configured to function as inter-row gates.

19. The semiconductor device of claim 1, further comprising an inverter configured to invert an input signal of the inverter into an output signal of the inverter, the output signal being an inverted signal of the input signal.

20. The semiconductor device of claim 19, wherein:

the input signal of the inverter is also an input signal of two gates of a particular XC, and the output signal of the inverter is an input signal of remaining gates of the particular XC.

* * * * *